United States Patent [19]
Wong et al.

[11] Patent Number: 5,652,533
[45] Date of Patent: Jul. 29, 1997

[54] CIRCUIT FOR GENERATING SAMPLING SIGNALS AT CLOSELY SPACED TIME INTERVALS

[75] Inventors: Hee Wong, San Jose; Gabriel Li, San Francisco, both of Calif.

[73] Assignee: National Semiconductor Corporation, Santa Clara, Calif.

[21] Appl. No.: 545,560

[22] Filed: Oct. 19, 1995

[51] Int. Cl.$^6$ ........................... H03K 5/22
[52] U.S. Cl. .................. 327/76; 327/170; 341/123
[58] Field of Search .................. 327/74, 75, 76, 327/91, 175, 131, 132, 133, 135, 170; 341/122–125

[56] References Cited

U.S. PATENT DOCUMENTS

| | | | |
|---|---|---|---|
| 3,675,238 | 7/1972 | Butscher | 327/75 |
| 4,183,016 | 1/1980 | Sawagata | 327/75 |
| 4,386,339 | 5/1983 | Henry et al. | 327/75 |
| 4,533,903 | 8/1985 | Yamada et al. | 327/75 |
| 4,542,370 | 9/1985 | Yamada et al. | 327/75 |
| 4,584,695 | 4/1986 | Wong et al. | 375/81 |
| 5,132,633 | 7/1992 | Wong et al. | 331/17 |
| 5,367,204 | 11/1994 | Mattison | 327/75 |
| 5,373,400 | 12/1994 | Kovacs | 327/74 |
| 5,394,020 | 2/1995 | Nienaber | 327/74 |
| 5,438,593 | 8/1995 | Karam et al. | 327/75 |
| 5,537,068 | 7/1996 | Konno | 327/175 |

*Primary Examiner*—Timothy P. Callahan
*Assistant Examiner*—My-Trang Nu Ton
*Attorney, Agent, or Firm*—Skjerven, Morrill, MacPherson, Franklin & Friel LLP; Ronald J. Meetin

[57] ABSTRACT

An electronic circuit suitable for sampling an incoming data bit stream in order to recover the information contained in the data stream contains an input section, a reference section, and a comparing section. The input section produces a ramp signal that switches between a first endpoint voltage and a second endpoint voltage in a periodic manner. The reference section furnishes a plurality of reference voltages between the two endpoint voltages. The comparing section compares the ramp signal to the reference voltages to produce corresponding sampling signals. Each sampling signal makes a first voltage transition as the ramp signal passes a corresponding reference voltage in going from the second endpoint voltage to the first endpoint voltage. Accordingly, the first transitions of the sampling signals occur in groups, each group being spread out in time during part of a period of the ramp signal. A data sampling portion of the circuit utilizes the sampling signals to sample the input data bit stream.

30 Claims, 6 Drawing Sheets

CIRCUIT FOR GENERATING SAMPLING SIGNALS AT CLOSELY SPACED TIME INTERVALS

FIELD OF USE

This invention relates to the generation of sampling signals which make transitions closely separated in time. This invention also relates to the use of such sampling signals for determining the content of data contained in an incoming data bit stream.

BACKGROUND ART

Electronic information is commonly transmitted in the form of data bits, each being a binary "0" (hereafter simply "0") or a binary "1" (hereafter simply "1"). The "0" and "1" values can, for example, respectively represent low and high voltages.

In order to successfully transfer electronic information from a transmitting station to a receiving station, the receiver must be able to distinguish the boundaries of the individual bits in the incoming data stream. While the transmitter and receiver can use precisely matched clocks to facilitate recovering the data, the receiver clock inevitably drifts relative to the transmitter clock. One technique for alleviating the drift problem is to provide the transmitter clock to the receiver so that the receiver clock can be synchronized to the transmitter clock. In Manchester encoding, the transmitter clock is furnished to the receiver by incorporating transmitter clock signals in the serial data stream sent out by the transmitter.

Wong et al, U.S. Pat. No. 4,584,695, discloses a decoder which decodes a Manchester-encoded data stream. The transmitter clock in Wong et al is recovered by sampling each incoming Manchester-encoded data bit at three points referred to as the early ("E"), middle ("M"), and late ("L") sampling points.

The voltage curves of FIG. 1 are helpful in understanding the operation of the decoder in Wong et al. The upper curve represents an incoming Manchester-encoded data stream $V_{RDI}$. Due to the exclusive ORing used in Manchester encoding, each data bit in the $V_{RDI}$ stream has a mid-bit transition that corresponds to a transmitter clock signal. A downward mid-bit transition indicates a "0" bit value, while an upward mid-bit transition indicates a "1." The lower voltage curve in FIG. 1 is a receiver clock signal $V_{R4XCK}$ that runs at four times the main receiver clock.

Clock $V_{R4XCK}$, upon being generated by suitable processing of incoming data $V_{RDI}$, is used to sample data stream $V_{RDI}$ at the early, middle, and late points, each consecutive pair of which are separated by 25% of the estimated data bit period. A difference in binary value between the early and late samples indicates the presence of a mid-bit transition. The value of the middle sample indicates whether the receiver clock, and thus also 4X clock $V_{R4XCK}$, must be advanced or retarded to match the transmitter clock.

The three-point sampling technique of Wong et al has been useful. However, Wong et al is limited to decoding Manchester-encoded signals having mid-bit transitions that convey the transmitter clock. In addition, the three-point technique of Wong et al indicates whether the receiver clock is to be advanced or retarded but does not indicate how much advancement or retardation is needed. It would be desirable to have a highly accurate sampling circuit which is suitable for upcoming high data-rate applications and which is capable of recovering the transmitter clock from a data stream that does not contain transmitter clock signals. It would also be desirable that such a sampling circuit be capable of providing an estimate of how much the receiver clock should be advanced or retarded to achieve synchronism with the transmitter clock.

GENERAL DISCLOSURE OF THE INVENTION

The present invention provides a circuit for generating a group of sampling signals that make transitions at closely spaced time intervals. The sampling signals are particularly suitable for sampling an incoming data bit stream in order to recover the information contained in the data stream. The sampling circuit of the invention furnishes information that enables the transmitter clock to be recovered from the incoming data stream regardless of whether transmitter clock signals are, or are not, incorporated in the data stream. The invention can thus be applied to Manchester-encoded data streams and, without the need for separately receiving the transmitter clock or using a receiver clock independently matched to the transmitter clock, also to data streams which do not contain transmitter clock signals. Accordingly, the invention has broad applicability.

The present sampling circuit can be configured to provide information indicating how much the receiver clock needs to be advanced or retarded in order to be synchronized closely to the transmitter clock. Furthermore, the circuit of the invention is typically arranged so that variations in the process used to fabricate the circuit elements do not significantly affect the sampling resolution from circuit to circuit. As a result, the present circuit is capable of accurately handling data streams moving at very high speeds. In short, the invention furnishes a substantial advance over the prior art.

The present sampling circuit contains an input section, a reference section, and a comparing section. The input section produces a ramp signal which switches between first and second endpoint voltages in a substantially periodic manner. The ramp signal preferably switches asymmetrically between the endpoint voltages. In particular, it typically takes longer for the ramp signal to go from the second endpoint voltage to the first endpoint voltage then vice versa. The input section preferably contains a capacitive element and a current source/sink configured so that the ramp signal goes from the second endpoint voltage to the first endpoint voltage at a rate dependent on discharge of the capacitive element through the current source/sink.

The reference section provides a plurality of different reference voltages having values between the endpoint voltages of the ramp signal. The comparing section compares the ramp signal to the reference voltages to produce a like plurality of sampling signals respectively corresponding to the reference voltages. Each sampling signal makes a first voltage transition in response to the ramp signal passing the corresponding reference voltage as the ramp signal goes from the second endpoint voltage to the first endpoint voltage. Consequently, the first transitions of the sampling signals are spread out in time during part of each period of the ramp signal. More particularly, the first transitions of the sampling signals occur at closely spaced time intervals during a portion of the time taken by the ramp signal to go from the second endpoint voltage to the first endpoint voltage.

A selected one of the sampling signals preferably has a 50% duty cycle. In response to the selected sampling signal, a control section adjusts the rate at which the ramp signal goes from the second endpoint voltage to the first endpoint voltage so as to force the selected sampling signal towards the 50% duty cycle. Typically, there is an odd number of sampling signals, of which the middle one has the 50% duty cycle. Each group of first transitions in the sampling signals then occurs in a short time interval approximately centered on the middle of each period of the ramp signal. This provides nearly maximum tolerance in the process variations of the fabrication process used to manufacture the present circuit.

An input data signal is supplied to the sampling circuit of the invention. In response to the input data signal and to the sampling signals, a data sampling portion of the circuit generates a plurality of primary data samples respectively corresponding to the sampling signals. Each primary data signal attains a value bearing a specified relationship (e.g., equality) to the instantaneous value of the input data signal that occurs when the corresponding sampling signal makes a first transition. Transitions in the primary data signals occur simultaneously in response to each group of first transitions in the sampling signals.

The data sampling portion of the circuit typically further generates a true data sample that attains a value bearing a specified relationship (again, e.g., equality) to the instantaneous value of the input data signal at a time that occurs between two consecutive groups of first transitions of the sampling signals. The data sampling portion also typically generates a previous data sample that attains a value bearing a specified relationship (once more, e.g., equality) to the immediately previous value of the true data sample. Transitions in the primary, true, and previous data samples preferably occur in synchronism with a sampling clock signal that delayingly corresponds to a selected one of the sampling signals.

The information in the primary, true, and previous data samples can be used to determine whether to advance or retard a receiver clock. For example, the input section typically generates the ramp signal in response to an input clock signal that corresponds to the receiver clock. A sample processing portion of the circuit furnishes the input clock signal. In doing so, the sample processing portion processes the primary, true, and previous data samples to determine whether, and how much, to advance or retard the input clock signal.

The number of sampling signals, and consequently the number of primary data samples, is normally at least three and preferably five or more. The information in the data samples can be employed to estimate an amount for advancing or retarding the receiver clock in addition to determining whether the receiver clock should be advanced or retarded. This enables the receiver clock to be tightly synchronized to the transmitter clock.

BRIEF DESCRIPTION OF THE DRAWINGS

Like reference symbols are employed in the drawings and in the description of the preferred embodiments to represent the same, or very similar, item or items.

DESCRIPTION OF THE PREFERRED EMBODIMENTS

Figure 1:
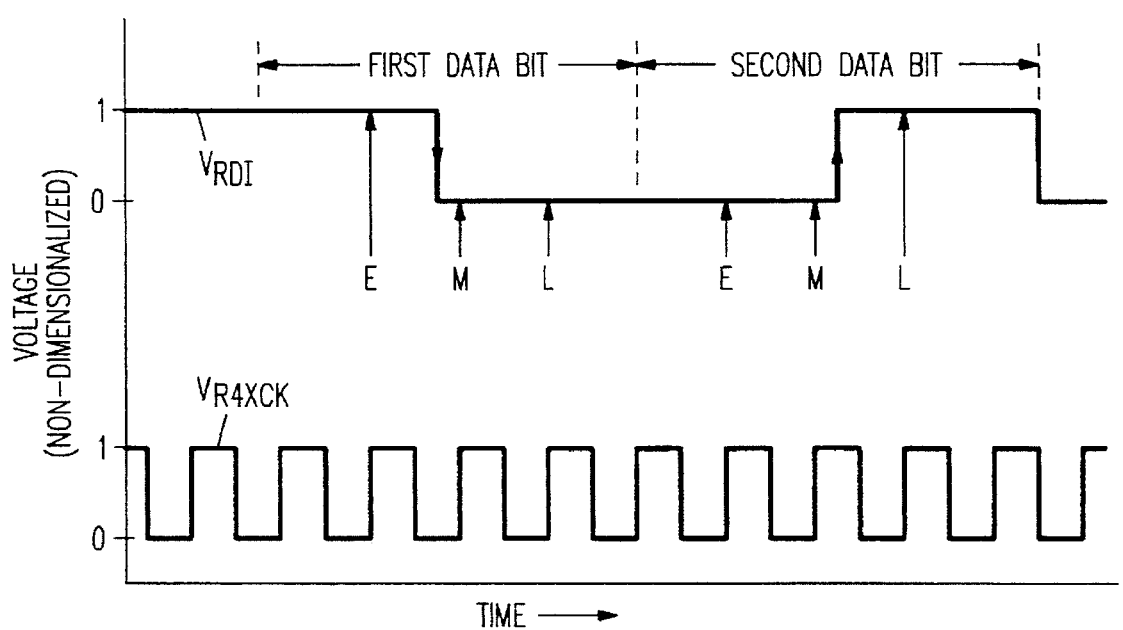
FIG. 1 is a graph of voltages that arise in decoding a Manchester-encoded data stream in a conventional decoder.
Figure 2:
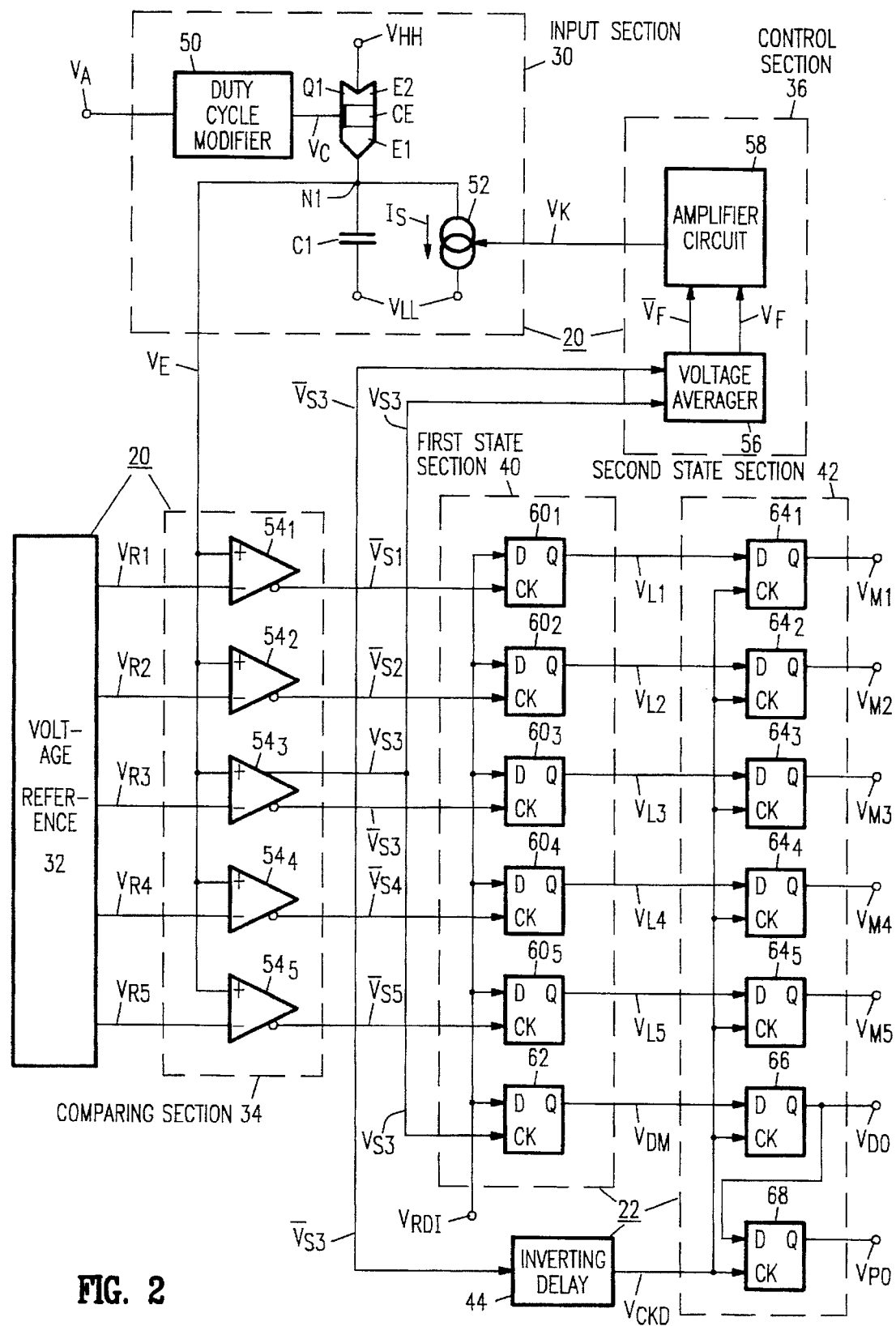
FIG. 2 is a block diagram of a sampling circuit that generates voltages for sampling, and provides samples of, an incoming data stream according to the invention.

Referring to FIG. 2, it illustrates an electronic circuit configured according to the teachings of the invention for sampling input data bit voltage signal $V_{RDI}$ in order to recover the digital information contained in the $V_{RDI}$ bit stream. As used here, such digital information, referred to generally as "data", includes substantive data as well as address and control information. In addition to recovering the data contained in the $V_{RDI}$ bit stream, the sampling circuit of FIG. 2 provides information for generating a receiver clock signal corresponding closely to the transmitter clock originally used in producing the $V_{RDI}$ stream.

Input data signal $V_{RDI}$ is typically a data stream which does not contain transmitter clock signals. A non-return-to-zero ("NRZ") data stream is a primary example of data signal $V_{RDI}$. Another example is an non-return-to-zero, invert-on-one ("NRZI") data stream. The circuit of FIG. 2 focuses on the bit boundaries in generating the receiver clock signal. Alternatively, input data signal $V_{RDI}$ could be a data stream, such as Manchester-encoded data, which contains imbedded clock signals. In such a case, the circuit of FIG. 2 would typically focus on the transmitter clock information—i.e., the mid-bit transitions for Manchester data—in generating the receiver clock.

The sampling circuit of FIG. 2 consists of a sampling-signal generating portion 20 and a data sampling portion 22. Sampling-signal generating portion 20 is formed with an input section 30, a voltage reference section 32, a comparing section 34, and a control section 36. Data sampling portion 22 consists of a first state section 40, a second state section 42, and a delay section 44. Sampling-signal generator 20 and data sampler 22 are connected between a source of a low supply voltage $V_{LL}$, typically 0 volt (ground), and a source of a high supply voltage $V_{HH}$, typically 3.3–5.0 volts.

Input section 30 produces a ramp voltage signal $V_E$ in response to a recovered input receiver clock signal $V_A$ which operates at a 50% duty cycle. The frequency of receiver clock $V_A$ is typically twice the frequency of the primary receiver clock corresponding to the bit boundaries of the $V_{RDI}$ data.

Ramp voltage signal $V_E$ switches between a low endpoint value $V_{EL}$ and a high endpoint value $V_{EH}$ in a substantially periodic manner. Low endpoint voltage $V_{EL}$ is close to $V_{LL}$, typically no more than 1 volt above $V_{LL}$. Endpoint Voltage $V_{EL}$ usually varies across a small range. High endpoint voltage $V_{EH}$ is close to $V_{HH}$, typically no more than 1 volt below $V_{HH}$. Endpoint voltage $V_{HH}$ may also vary across a small range. As discussed further below, ramp voltage $V_E$ normally switches asymmetrically between $V_{EL}$ and $V_{EH}$.

Input section 30 is formed with a duty cycle modifier 50, a switching transistor Q1, a capacitive element C1 represented here as a capacitor, and a current source/sink 52 which provides a substantially constant sinking current $I_S$.

Duty cycle modifier 50 converts input clock $V_A$ into an intermediate voltage clock signal $V_C$ which makes voltage transitions at a period greater than that of input clock $V_A$. The $V_C$ clock period is typically twice the $V_A$ clock period and thus equals the primary receiver clock period. Intermediate voltage $V_C$ has a non-50% duty cycle. In the typical case, the $V_C$ duty cycle is either 75% for which the $V_C$ high-voltage time is approximately three times the $V_C$ low-voltage time, or 25% for which the $V_C$ high-voltage time is approximately one third the $V_C$ low-voltage time.

Switching transistor Q1 has a control electrode that receives intermediate voltage $V_C$, a first flow electrode E1 connected to a circuit node N1 at which ramp signal $V_E$ is provided, and a second flow electrode E2 coupled to the $V_{HH}$ supply. Control electrode CE switches the current flow between flow electrodes E1 and E2 in response to voltage $V_C$.

Transistor Q1 may be a field-effect transistor ("FET"), normally a P-channel FET, for which electrode CE is the gate electrode. Electrodes E1 and E2 then respectively are the drain and source in the P-channel case, and vice versa in the N-channel case. Alternatively, transistor Q1 may be a bipolar transistor, normally a PNP device, for which electrode CE is the base. Electrodes E1 and E2 then respectively are the collector and emitter in the PNP case, and vice versa in the NPN case.

Implementing transistor Q1 with a P-channel FET or a PNP device is preferred because the $V_{EL}$-to-$V_{EH}$ voltage range for ramp signal $V_E$ is greater than in the N-channel or NPN case. The 75% duty cycle is utilized for intermediate voltage $V_C$ when transistor Q1 is a P-channel FET or a PNP transistor. The 25% $V_C$ duty cycle is employed when transistor Q1 is an N-channel FET or an NPN transistor.

Capacitive element C1 and current source/sink 52 are connected in parallel between node N1 and the $V_{LL}$ supply. Current source/sink 52 is sized so that its discharge sinking current $I_S$ is considerably less than the maximum current flowing through transistor Q1 when it is turned fully on.

With the foregoing in mind, input section 30 operates in the following manner. The $V_E$ period equals the $V_C$ period. When duty cycle modifier 50 switches intermediate voltage $V_C$ to a value that causes transistor Q1 to turn on, current from the $V_{HH}$ supply flows through transistor Q1 to charge capacitive element C1 very rapidly. Ramp signal $V_E$ moves rapidly, essentially instantaneously, from low endpoint voltage $V_{EL}$ up to high endpoint voltage $V_{EH}$ to begin a $V_C$ or $V_E$ period.

When intermediate voltage $V_C$ is switched to a value that causes transistor Q1 to turn off, capacitive element C1 discharges primarily through current source/sink 52 to the $V_{LL}$ supply. Ramp signal $V_E$ then returns to low endpoint voltage $V_{EL}$. Because discharge sinking current $I_S$ is considerably less than the charging current that flows through transistor Q1 during the charging of element C1, ramp signal $V_E$ drops to low endpoint voltage $V_{EL}$ (near $V_{LL}$) at a rate much lower than the rate at which signal $V_E$ rises to high endpoint voltage $V_{EH}$.

Discharge sink current $I_S$ is set at a nominal value that causes voltage $V_E$ to reach $V_{EL}$ at the end of the $V_E$ period. Ramp signal $V_E$ then begins immediately to move rapidly up to $V_{EH}$ as the next $V_E$ period is initiated. Alternatively, sink current $I_S$ could be nominally placed at a value which enables voltage $V_E$ to remain at $V_{EL}$ for a short time interval (typically no more than 25% of the $V_E$ period). Since current $I_S$ is relatively constant during the $V_E$ downward transition, the rate at which voltage $V_E$ drops is approximately constant during most of the $V_E$ fall time, particularly near the middle of the downward transition interval. This slow (compared to the $V_E$ rise rate), relatively constant $V_E$ fall rate is important to the operation of the present sampling circuit.

Figure 3:
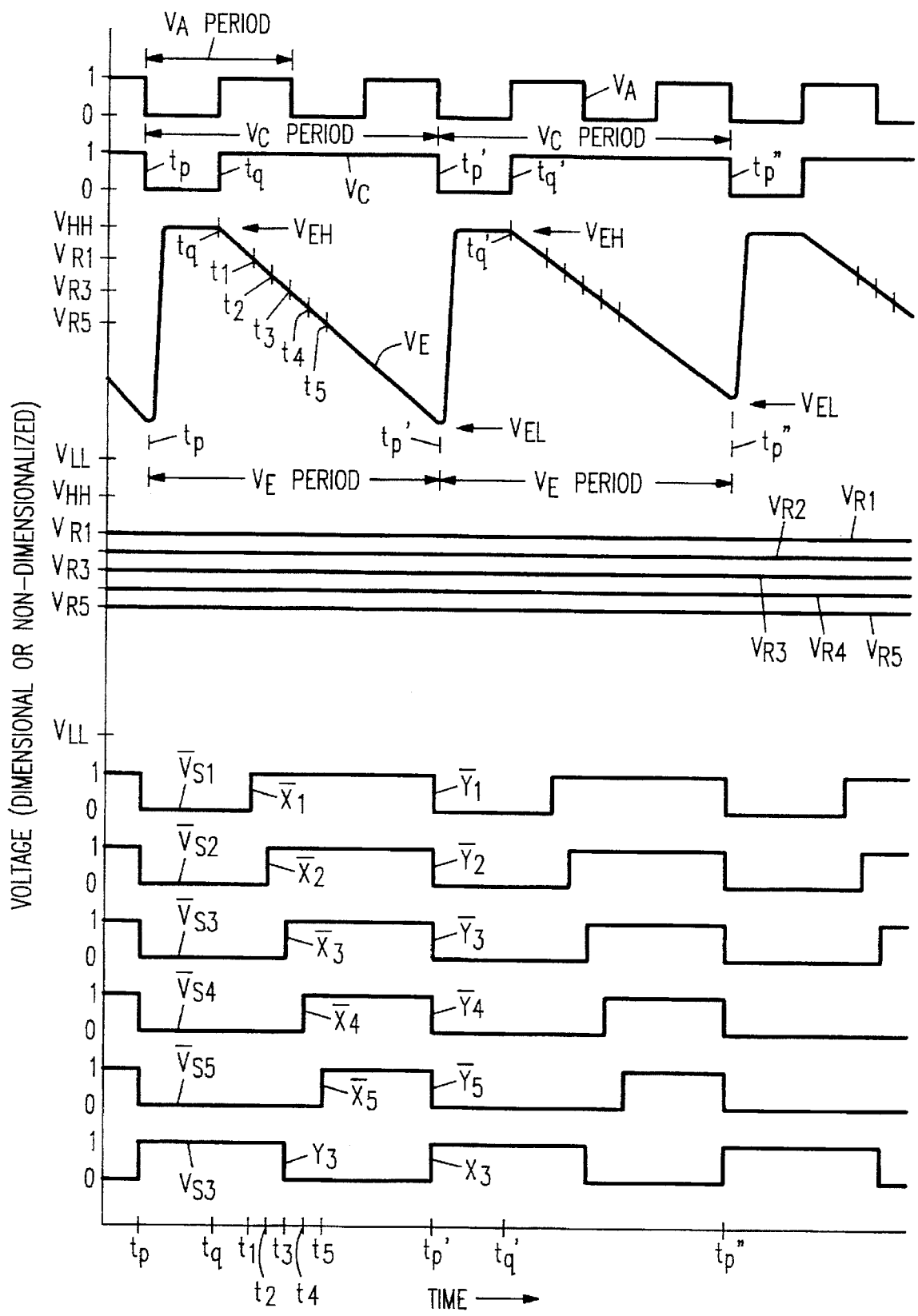
FIG. 3 is a graph of voltages that arise in generating the sampling voltages in the sampling circuit of FIG. 2.

FIG. 3 depicts voltage curves helpful in understanding the operation of input section 30. The curves in FIG. 3 represent an embodiment in which transistor Q1 is a P-channel FET (or a PNP transistor). Duty cycle modifier 50 converts input clock $V_A$ at the 50% input duty cycle into intermediate voltage $V_C$ at a 75% duty cycle as indicated by the two upper curves in FIG. 3.

Times $t_p$ and $t_p'$ in FIG. 3 represent the start of two $V_C$ (or $V_E$) periods. The time interval $t_p-t_p'$ is the first $V_C$ period. The time interval $t_p'-t_p''$ similarly is the second $V_C$ period. Times $t_q$ and $t_q'$ respectively occur during the first and second $V_C$ periods.

At time $t_p$, intermediate voltage $V_C$ rapidly goes low, causing transistor Q1 to turn on hard since it is a P-channel FET. Ramp signal $V_E$ goes rapidly from $V_{EL}$ (somewhat above $V_{LL}$) to $V_{EH}$ (very close to $V_{HH}$) as shown by the $V_E$ curve in FIG. 3. At time $t_q$ approximately 25% of the way along the first $V_C$ period, voltage $V_C$ rapidly goes high. Transistor Q1 turns off quickly. Because capacitive element C1 discharges primarily through current source/sink 52, ramp signal $V_E$ drops slowly at a relatively constant rate towards $V_{EL}$ and substantially reaches $V_{EL}$ at time $t_p'$. This ends the first $V_E$ period as shown in FIG. 3.

Subject to the controlling action provided by control section 30 (discussed further below), the foregoing events are repeated during the next $V_E$ (or $V_C$) period. Time intervals $t_p'-t_q'$ and $t_q'-t_p''$ in the second $V_E$ period respectively correspond to intervals $t_p-t_q$ and $t_q-t_p'$ in the first $V_E$ period.

Voltage reference section 32 provides an odd number N of reference voltages $V_{R1}, V_{R2}, \ldots V_{RN}$ at approximately equally spaced intervals between the $V_{EL}$ and $V_{EH}$ endpoint voltages. Reference voltage $V_{R1}$ has the highest reference value, while reference voltage $V_{RN}$ has the lowest reference value. For the normal situation in which ramp signal $V_E$ reaches $V_{EL}$ at the end of each $V_E$ period, the $V_{R1}-V_{RN}$ range is closer to $V_{EH}$ than to $V_{EL}$. N is at least 3 and preferably 5, the case shown in FIG. 2, or more. The middle curves in FIG. 3 represent five reference voltages $V_{R1}-V_{R5}$.

Comparing section 34 consists of N voltage comparators $54_1, 54_2, \ldots 54_N$. Each comparator $54_i$, where i is an integer running from 1 to N, compares reference voltage $V_{Ri}$ with ramp voltage signal $V_E$ to produce a corresponding inverted sampling (or timing) voltage signal $\overline{V}_{Si}$. Accordingly, comparing section 34 provides N inverted sampling signals $\overline{V}_{S1}, \overline{V}_{S2}, \ldots \overline{V}_{SN}$. For the exemplary case shown in FIG. 2 where N is 5, comparators $54_1-54_5$ thereby respectively compare reference voltages $V_{R1}-V_{R5}$ to ramp signal $V_E$ to produce sampling voltages $\overline{V}_{S1}-\overline{V}_{S5}$ as shown near the bottom of FIG. 3.

During time interval $t_q-t_p'$ in which ramp signal $V_E$ drops from $V_{EH}$ to $V_{EL}$, each sampling signal $\overline{V}_{Si}$ makes a low-to-high voltage transition $\overline{X}_i$ at a time $t_i$ when voltage $V_E$ passes reference voltage $V_{Ri}$. Because the fall rate of ramp signal $V_E$ is slow and relatively constant, low-to-high transitions $\overline{X}_1, \overline{X}_2, \ldots \overline{X}_N$ occur in a group respectively at times $t_1, t_2, \ldots t_N$ spread out equally across a central portion of time interval $t_q-t_p'$. The interval $\Delta t$ between consecutive times $t_i$ and $t_{i+1}$ is approximately the same for all such intervals. For the case in which N is 5, FIG. 3 illustrates times $t_1-t_5$ when ramp signal $V_E$ respectively passes reference voltages $V_{R1}-V_{R5}$ so as to cause transitions $\overline{X}_1-\overline{X}_5$ in sampling signals $\overline{V}_{S1}-\overline{V}_{S5}$.

Returning to the case of arbitrary N, low-to-high transitions $\overline{X}_1-\overline{X}_N$ in sampling signals $\overline{V}_{S1}-\overline{V}_{SN}$ typically occur quite fast. To a first approximation, the time occupied by all N transitions $\overline{X}_1-\overline{X}_N$ approximately equals the $t_1-t_N$ interval that extends from the beginning of the $\overline{X}_1$ transition to the beginning of the $\overline{X}_N$ transition. The length of the $t_1-t_N$ interval depends on the value of the $V_E$ fall rate and on the values of reference voltages $V_{R1}-V_{RN}$. The $V_E$ fall rate, as indicated by the value of low endpoint voltage $V_{EL}$, varies across a small range due to fabrication process variations. Accordingly, the $t_1-t_N$ interval can be accurately controlled so as to be quite small. Sampling signals $\overline{V}_{S1}-\overline{V}_{SN}$ then make transitions $\overline{X}_1-\overline{X}_N$ at distinct, accurately controllable, closely spaced time intervals.

Importantly, during fabrication of the sampling circuit of FIG. 2 in integrated circuit form, run-to-run variations in the fabrication parameters that determine the quantitative value of the $t_1-t_N$ interval tend to cancel out. This occurs as a result of the feedback mechanism, discussed below, which causes the $\overline{X}_3$ transition to be approximately in the middle of the $V_E$ ramp period, thereby forcing the $\overline{X}_5$ transition to be relatively far from the end of the $V_E$ downward ramp. Consequently, the length of the $t_1-t_N$ interval does not vary greatly from one integrated circuit to another in a fabrication run or from run to run. The high sampling resolution achievable with the invention can thereby be tightly controlled during volume IC production to meet strict performance specifications.

When ramp signal $V_E$ returns to $V_{EH}$, sampling signals $\overline{V}_{S1}-\overline{V}_{SN}$ make rapid high-to-low voltage transitions $\overline{Y}_1$, $\overline{Y}_2$, ... $\overline{Y}_N$ as voltage $V_E$ again passes reference voltages $V_{R1}-V_{RN}$. Since voltage $V_E$ returns to $V_{EH}$ very rapidly, high-to-low transitions $\overline{Y}_1-\overline{Y}_N$ occur at approximately the same time, essentially time $t_p'$. This is illustrated in FIG. 3 by simultaneous transitions $\overline{Y}_1-\overline{Y}_5$ in voltages $\overline{V}_{S1}-\overline{V}_{S5}$.

Middle comparator $54_M$, where M where equals (N+1)/2, in comparing section 34 also provides a non-inverted sampling signal $V_{SM}$ that makes a rapid high-to-low transition $Y_M$ at middle time $t_M$ when ramp signal $V_E$ passes reference voltage $V_{RM}$ in going from $V_{EH}$ to $V_{EL}$ during interval $t_q-t_p'$. At time $t_p'$ non-inverted middle sampling signal $V_{SM}$ makes a rapid low-to-high voltage transition $X_M$. Middle voltages $V_{SM}$ and $\overline{V}_{SM}$ are thus substantially complementary. In the example of FIG. 2, middle comparator $54_M$ is comparator $54_3$ which provides non-inverted sampling signal $V_{S3}$ shown graphically at the bottom of FIG. 3. Non-inverted middle sampling signal $V_{S3}$ makes transition $Y_3$ at middle time $t_3$ and later makes transition $X_3$ at time $t_p'$.

Control section 36 controls the sampling circuit in such a way that inverted middle sampling signal $\overline{V}_{SM}$ has approximately a 50% duty cycle. As a result, the $t_1-t_N$ interval during which sampling signals $\overline{V}_{S1}-\overline{V}_{SN}$ make transitions $\overline{X}_1-\overline{X}_N$ occurs in a narrow, relatively central portion of the $V_E$ period. This enables the $\Delta t$ interval between consecutive $\overline{X}_i$ transitions to be very nearly the same across the $t_1-t_N$ interval. In particular the $t_1-t_N$ interval is prevented from getting too close to the end of the $V_E$ period (at time $t_p'$) where non-constancy in the $V_E$ fall rate could otherwise cause interval $\Delta t$ to vary significantly from the $t_1$ end of the interval to the $t_N$ end. The sensitivity to fabrication process variations from circuit to circuit is reduced, and the ability to provide accurate proportional correction of the receiver clock signal is enhanced.

In particular, control section 36 controls sink current $I_S$ in response to middle sampling signals $V_{SM}$ and $\overline{V}_{SM}$—i.e., voltages $V_{S3}$ and $\overline{V}_{S3}$ in FIG. 2. Control section 36 is formed with a voltage averaging circuit 56 and an amplifying circuit 58. Voltage averager 56 filters middle sampling signals $V_{SM}$ and $\overline{V}_{SM}$ to respectively produce complementary filtered voltage signals $V_F$ and $\overline{V}_F$. Filtered voltages $V_F$ and $\overline{V}_F$ approximately equal the time-averaged values of voltages $V_{SM}$ and $\overline{V}_{SM}$. Amplifier circuit 58 amplifies the difference between averaged voltages $V_F$ and $\overline{V}_F$ to produce a control voltage signal $V_K$ which is supplied to current source/sink 52 for regulating the value of sink current $I_S$.

When inverted middle sampling signal $\overline{V}_{SM}$ (e.g., $\overline{V}_{S3}$) has a greater duty cycle than non-inverted middle sampling signal $V_{SM}$ (e.g., $V_{S3}$), averaged voltage $\overline{V}_F$ is greater than averaged voltage $V_F$. In response, amplifier circuit 58 decreases control voltage $V_K$, causing sink current $I_S$ to decrease. During time interval $t_q'-t_p''$ in the second $V_E$ period, ramp signal $V_E$ then drops even more slowly from $V_{EH}$ to $V_{EL}$. This is illustrated by the second $V_E$ period in FIG. 3 where the value of low endpoint voltage $V_{EL}$ is slightly higher at time $t_p''$ than at time $t_p'$.

The reduction in the $V_E$ fall rate causes the duty cycle of inverted middle sampling signal $\overline{V}_{SM}$ to be reduced and thus moved towards the duty cycle of non-inverted middle sampling signal $V_{SM}$. The reverse occurs when inverted middle sampling signal $\overline{V}_{SM}$ has a lower duty cycle than non-inverted middle sampling signal $V_{SM}$. Middle sampling signals $\overline{V}_{SM}$ and $V_{SM}$ thereby converge on the same duty cycle. Inasmuch as voltages $\overline{V}_{SM}$ and $V_{SM}$ together have a 100% composite duty cycle (because they are complementary), signals $\overline{V}_{SM}$ and $V_{SM}$ both substantially reach a 50% duty cycle.

Using sampling signals $\overline{V}_{S1}-\overline{V}_{SN}$ as clock inputs, state section 40 samples input data signal $V_{RDI}$ at times $t_1-t_N$ when transitions $\overline{X}_1-\overline{X}_N$ occur. State section 40 provides N initial data samples $V_{L1}, V_{L2}, \ldots V_{LN}$ at N separate, but closely spaced, points of the $V_{RDI}$ data stream. For this purpose, state section 40 contains N D-type rising-edge-triggered flip-flops $60_1, 60_2, \ldots 60_N$ that receive the $V_{RDI}$ data stream at their data inputs. Each flip-flop $60_i$ receives sampling signal $\overline{V}_{Si}$ at the clock input. When sampling signal $\overline{V}_{Si}$ makes transition $\overline{X}_i$, the rising transition at the clock input of flip-flop $60_i$ causes the then-existing $V_{RDI}$ value to be loaded into flip-flop $60_i$ and supplied as the value of data sample $V_{Li}$.

Figure 4:
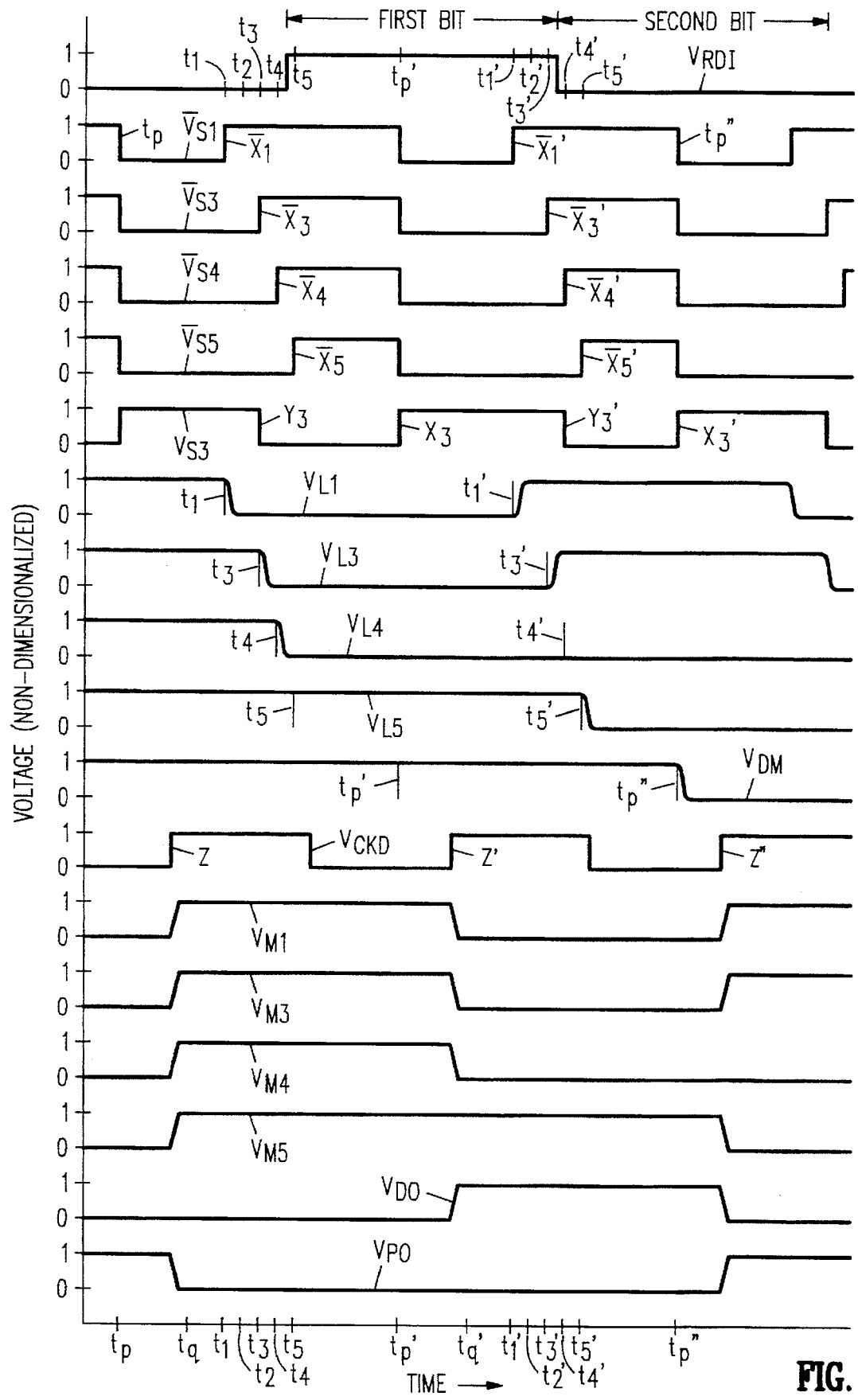
FIG. 4 is a graph of voltages that arise when the sampling voltages in the sampling circuit of FIG. 2 are applied to an input data stream.

FIG. 4 presents voltage curves that facilitate an understanding of state section 40 and the other components in data sampling section 22. The upper curve in FIG. 4 represents input data signal $V_{RDI}$, assumed to be a data stream of the NRZ (or NRZI) type. Accordingly, state section 40 focuses on the $V_{RDI}$ bit boundaries in generating data samples $V_{L1}-V_{L5}$.

The next four voltage curves in FIG. 4 represent four of sampling signals $\overline{V}_{S1}-\overline{V}_{S5}$, sampling signal $\overline{V}_{S2}$ (along with other parameters relating to time $t_2$) not being shown in FIG. 4 to avoid overcrowding the figure. As in FIG. 3, non-inverted middle sampling voltage $V_{S3}$ is presented after the $\overline{V}_{Si}$ curves in FIG. 4. Curves for four of data samples $V_{L1}-V_{L5}$ appear in the middle of FIG. 4.

The first full $V_{RDI}$ bit in FIG. 4 is a "1". At times $t_1-t_5$, low-to-high transitions $\overline{X}_1-\overline{X}_5$ in sampling voltages $\overline{V}_{S1}-\overline{V}_{S5}$ occur in the vicinity of the beginning of the first full bit. The instantaneous values of input data signal $V_{RDI}$ at times $t_1-t_5$ respectively are (00001) in the example illustrated in FIG. 4. Transitions $\overline{X}_1-\overline{X}_5$ cause these instantaneous values to be loaded into flip-flops $60_1-60_5$ so that data samples $V_{L1}-V_{L5}$ respectively provide (00001) during the first sampling period.

The second full $V_{RDI}$ bit in FIG. 4 is a "0". In the vicinity of the beginning of the second-full bit, sampling signals $\overline{V}_{S1}-\overline{V}_{S5}$ respectively make low-to-high transitions $\overline{X}_1'-\overline{X}_5'$ at times $t_1'-t_5'$. The instantaneous values of input data signal $V_{RDI}$ respectively are (11100) at times $t_1-t_5$ in the illustrated example. The sampling performed with sampling signals $\overline{V}_{S1}-\overline{V}_{S5}$ at transitions $\overline{X}_1'-\overline{X}_5'$ causes data samples $V_{L1}-V_{L5}$ to be respectively provided as (11100) during the second sampling period.

First state section 40 also generates an intermediate true voltage data sample $V_{DM}$ which, when a single transition occurs in data samples $V_{L1}-V_{LN}$ during a sampling period, conveys the actual value of the $V_{RDI}$ data bit being received. This is done with an additional D-type rising-edge-triggered flip-flop 62 that receives data signal $V_{RDI}$ at the data input and non-inverted middle sampling signal $V_{SM}$ (e.g., $V_{S3}$) at the clock input. Assuming that a single transition indeed occurs in data samples $V_{L1}-V_{LN}$ during the sampling period, a low-to-high transition $X_M$ (e.g., $X_3$) occurs at time $t_p'$ near the middle of the $V_{RDI}$ data bit interval at a point where input signal $V_{RDI}$ is safely at the actual value for the data bit. When sampling signal $V_{SM}$ makes transition $X_M$, the rising transition at the clock input of flip-flop 62 causes the bit value of the $V_{RDI}$ sample to be loaded into flip-flop 62 and supplied as the value of true data sample $V_{DM}$.

In the example of FIG. 4, the "1" value of the first data bit is clocked into flip-flop 62, causing data sample $V_{DM}$ to be provided at a "1" immediately after time $t_p'$ as shown by the $V_{DM}$ curve in FIG. 4. For the second data bit in FIG. 4, non-inverted sampling signal $V_{S3}$ makes a low-to-high transition $X_3'$ at time $t_p''$ near the middle of the second $V_{DRI}$ bit. The "0" value of the second data bit is similarly clocked into flip-flop 62 at time $t_p''$ such that data sample $V_{DM}$ falls to a "0" as indicated in FIG. 4.

Flip-flops $60_1-60_N$ and 62 are all loaded at different times during the sampling of a data bit. Accordingly, state section 42 generates N simultaneously changeable primary voltage data samples $V_{M1}, V_{M2}, \ldots V_{MN}$ that respectively reflect that values of data samples $V_{L1}-V_{LN}$ at a time after the value of the current data bit is loaded into flip-flop 62. This is accomplished with N rising-edge-triggered D-type flip-flops $64_1, 64_2, \ldots 64_N$ which respectively receive data samples $V_{L1}-V_{LN}$ at their data inputs. A sampling state clock signal $V_{CKD}$ that makes a rising voltage transition shortly after the loading of flip-flop 62 is supplied to all of flip-flops $64_1-64_N$ to generate primary data samples $V_{M1}-V_{MN}$ in the preceding manner.

State section 42 provides a final true voltage data sample $V_{DO}$ which reflects the value of true data sample $V_{DM}$ when data samples $V_{M1}-V_{MN}$ are updated. State section 42 accomplishes this with a rising-edge-triggered D-type flip-flop 66 which receives true intermediate data sample $V_{DM}$ at the data input and sampling state clock signal $V_{CKD}$ at the clock input. When data samples $V_{L1}-V_{LN}$ are loaded into flip-flops $64_1-64_N$ on the rising edge of clock signal $V_{CKD}$ to produce data samples $V_{M1}-V_{MN}$, intermediate true data signal $V_{DM}$ is simultaneously loaded into flip-flop 66 on the rising edge of the state clock signal to produce final true data sample $V_{DO}$.

State section 42 generates a final voltage data sample $V_{PO}$ equal to the immediately previous value of true data sample $V_{DO}$. This is accomplished with a rising-edge-triggered D-type flip-flop 68 which receives state clock $V_{CKD}$ at the clock input. Current true data sample $V_{DO}$ is provided to the data input of flip-flop 68. The value of true data sample $V_D$ during the previous sampling period is thus loaded into flip-flop 68 at the rising edge of state clock $V_{CKD}$.

Delay section 44 furnishes state clock signal $V_{CKD}$ in response to one of sampling signals $\overline{V}_{S1}-\overline{V}_{SN}$ and $V_{SM}$. In the example shown in FIG. 2, delay section 44 provides state clock $V_{CKD}$ as an inverted, delayed version of middle sampling signal $\overline{V}_{S3}$. The length of the delay is chosen so that state clock $V_{CKD}$ makes a low-to-high transition after flip-flop 62 is loaded for the current data bit but before the beginning of the sampling period for the next data bit.

The operation of state section 42 and delay section 44 is illustrated by the $V_{Mi}, V_{DO},$ and $V_{PO}$ voltage curves in the bottom third of FIG. 4. Delayed state clock $V_{CKD}$ makes low-to-high transitions Z, Z', and Z". At transition Z which occurs during the $t_p-t_q$ interval, data samples $V_{M1}-V_{M5}$ and $V_{DO}$ are updated to reflect the values of data samples $V_{L1}-V_{L5}$ and $V_{DM}$ for the data bit that occurred before the first full data bit shown in FIG. 4. Previous data sample $V_{PO}$ is updated at transition Z to repeat the $V_{DO}$ value of the sampling period before the first partial sample period depicted in FIG. 4.

At transition Z' which occurs during the $t_p'-t_q'$ interval and thus before ramp signal $V_E$ starts dropping from $V_{EH}$ to $V_{EL}$ during the second $V_E$ period in FIG. 4, the values of data samples $V_{L1}-V_{L5}, V_{DM},$ and $V_{DO}$ are loaded into flip-flops $64_1-64_5$, 66, and 68. Data samples $V_{M1}-V_{M5}$ are then provided as (00001) for the first full data bit in FIG. 4, while the true data sample $V_{DO}$ is provided as a "1" for the first full bit. Previous data sample is furnished as a "0", the exemplary value for the first partial data bit in FIG. 4.

At transition Z", data samples $V_{M1}-V_{M5}$ are similarly provided as (11100) for the second full data bit in FIG. 4, while true data sample $V_{DO}$ is provided as a "0" for the second full bit. Previous data sample $V_{PO}$ now repeats the "1" value of the first full bit.

Data samples $V_{PO}, V_{M1}-V_{M5},$ and $V_{DO}$ are furnished to additional circuitry (described further below) that adjusts the timing of double-frequency receiver clock $V_A$ according to the $V_{PO}, V_{M1}-V_{M5},$ and $V_{DO}$ values. The transition between the fourth and fifth bits in the (00001) values of data samples $V_{M1}-V_{M5}$ for the first data bit in FIG. 4 indicates that receiver clock $V_A$ is behind the transmitter clock and needs to be advanced approximately 2Δt so that the $V_{RDI}$ transition occurs just before the middle of the first bit. As indicated above, Δt is the interval between consecutive $\overline{X}_i$ transitions. The transition between the third and fourth bits in the (11100) values of data samples $V_{M1}-V_{M5}$ for the second data bit indicates that receiver clock $V_A$ is close to being in synchronism with the transmitter clock. However, receiver clock $V_A$ is still behind the transmitter clock and needs to be advanced approximately 1Δt.

The converse applies when a transition occurs between the first and second $V_{Mi}$ bits or between the second and third $V_{Mi}$ bits. For example, (01111) values for data samples $V_{M1}-V_{M5}$ indicate that receiver clock $V_A$ is ahead of the transmitter clock and needs to be retarded approximately 2Δt. (11000) values for data samples $V_{M1}-V_{M5}$ indicate that receiver clock $V_A$ is close to being in synchronism with the transmitter clock but is still slightly ahead of the transmitter clock and needs to be retarded approximately 1Δt. At synchronism, data samples $V_{M1}-V_{M5}$ oscillate between (a) a transition between the second and third bit values and (b) a transition between the third and fourth bit values. Depending on the desired operational characteristics of the overall decoder that contains the sampling circuit of FIG. 2, the oscillation at synchronism may occur every sample period or at a selected interval of two or more sample periods.

True data sample $V_{DO}$ and previous data sample $V_{PO}$ are used in conjunction with primary samples $V_{M1}-V_{M5}$ to roughly synchronize receiver clock $V_A$ to the transmitter clock and to initially determine whether receiver clock $V_A$ needs to be advanced or retarded. Primary samples $V_{M1}-V_{M5}$ provide fine tuning. In this way, the circuit of FIG. 2 furnishes information which indicates whether the receiver clock is synchronized to the transmitter clock and, if not, approximately how much correction is needed to achieve synchronism.

Figure 5:
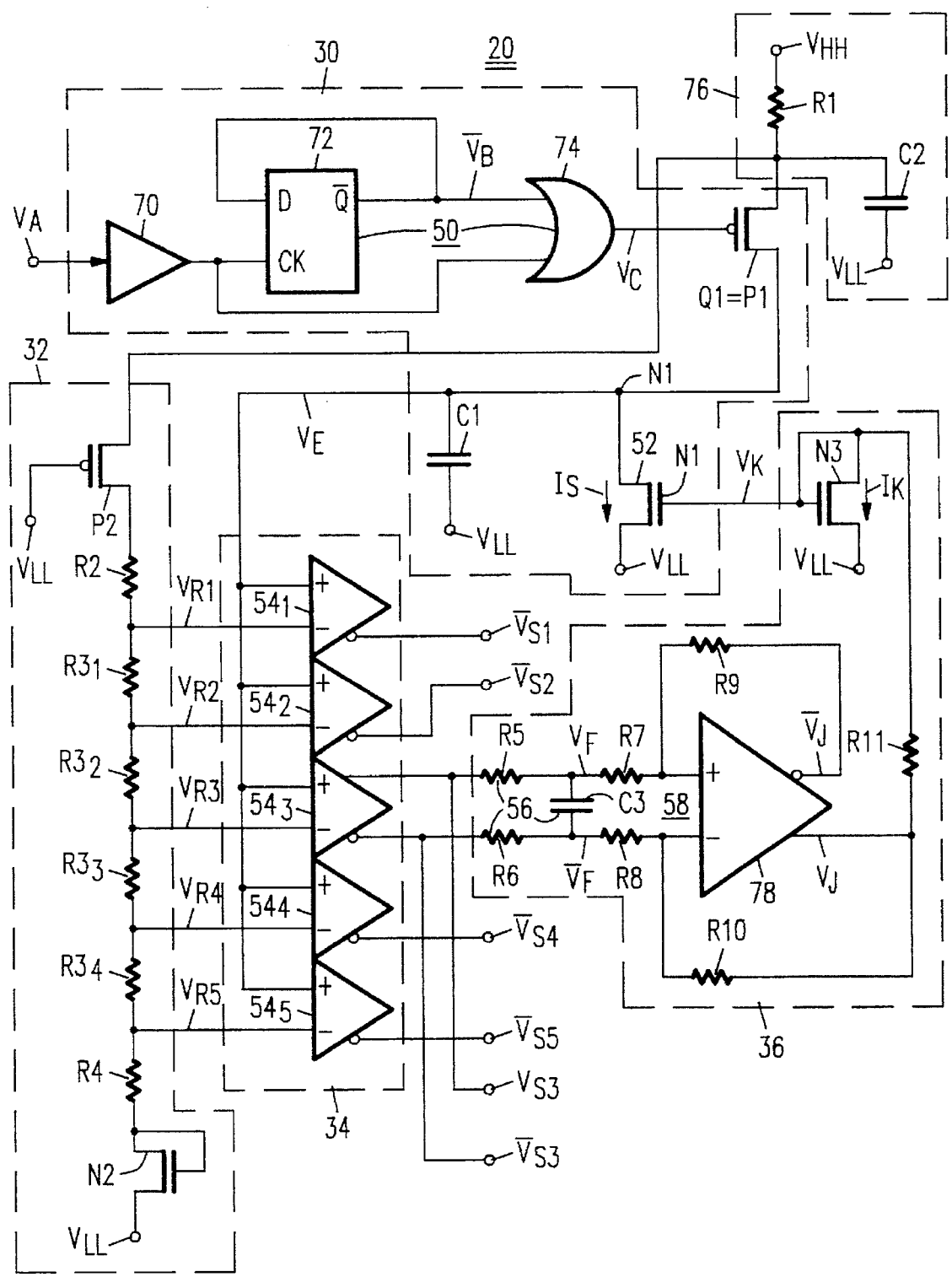
FIG. 5 is a block/circuit diagram of a portion of a preferred embodiment of the sampling circuit of FIG. 2.

FIG. 5 illustrates a preferred embodiment of sampling-signal generator 20 in the sampling circuit of FIG. 2. All of the field-effect transistors ("FETs") in FIG. 5 are enhancement-mode insulated-gate devices of the MOS type.

In input section 30 of FIG. 5, duty cycle modifier 50 consists of an input buffer 70, a rising-edge-triggered flip-flop 72, and an OR gate 74. Buffer 70 amplifies double-frequency receiver clock $V_A$ without changing its duty cycle. Flip-flop 72 provides a voltage clock signal $\overline{V}_B$ at twice the period, and thus half the frequency, of input clock $V_A$. Accordingly, clock $\overline{V}_B$ is at the frequency of the primary receiver clock. OR gate 70 ORs the $\overline{V}_B$ and buffered $V_A$ clocks to produce intermediate voltage signal $V_C$ at a 75% duty cycle.

Transistor Q1 in FIG. 5 is a P-channel FET P1. The source of FET P1 is coupled to the $V_{HH}$ supply through a low-pass filter 76 formed with a resistor R1 and a capacitor C2. Filter 76 typically has a 500-MHz 3-db corner frequency. Current source/sink 52 consists of an N-channel FET N1. Capacitive element C1 is a simple (polysilicon or diffused monosilicon junction) capacitor.

Voltage reference section 32 consists of a resistive divider formed with an upper resistor R2, four equal-value intermediate resistors $R3_1$, $R3_2$, $R3_3$, and $R3_4$, and a lower resistor R4. The upper end of the resistive divider is coupled through a P-channel FET P2 and through low-pass filter 76 to the $V_{HH}$ supply. FET P2 is the same (emitter) size as FET P1. The lower end of the resistive divider is coupled to the $V_{LL}$ supply by way of an N-channel FET N2 of the same size as FET N1.

In control section 36, voltage averager 56 consists of a capacitor C3 and equal-value resistors R5 and R6 which respectively receive middle sampling signals $V_{S3}$ and $\overline{V}_{S3}$. Capacitor C3, from which filtered voltages $V_F$ and $\overline{V}_F$ are taken, averages the charge corresponding to sampling signals $V_{S3}$ and $\overline{V}_{S3}$.

Amplifier circuit 58 is formed with equal-value input resistors R7 and R8, an operational amplifier 78, equal-value feedback resistors R9 and R10, an output resistor R11, and an N-channel FET N3. When voltages $V_F$ and $\overline{V}_F$ are equal, amplifier outputs $V_J$ and $\overline{V}_J$ are equal and are biased at approximately 3 volts. Circuit 58 amplifies the difference between filtered voltages $V_F$ and $\overline{V}_F$ to produce complementary voltage output signals $V_J$ and $\overline{V}_J$. Resistors R7 and R9, in combination with resistor R5, control the gain on the $\overline{V}_J$ side of circuit 58. Resistor R8 and R10, in combination with resistor R6, similarly control the gain on the $V_J$ side.

Resistor R11 and FET N3 convert amplifier output voltage $V_J$ into control voltage $V_K$ for current source/sink 52. FET N3, which is diode connected and which is the same size as FET N1 in source/sink 52, forms a current mirror with FET N1. Accordingly, sink current $I_S$ substantially equals the current $I_K$ flowing through FET N3 and resistor R11.

When the $\overline{V}_{S3}$ duty cycle exceeds the $V_{S3}$ duty cycle, the charge-averaging action of capacitor C3 causes voltage $\overline{V}_F$ to exceed voltage $V_F$. Control voltage $V_K$ then drops in value. This causes FET N3 to become less conductive, thereby reducing current $I_K$. FET N1 simultaneously becomes less conductive, causing sink current $I_S$ to decrease substantially the same as current $I_K$. As discussed above, the reduction in current $I_S$ causes ramp signal $V_E$ to fall more slowly during the $t_q$–$t_p'$ interval. The reverse occurs when the $\overline{V}_{S3}$ duty cycle is less than the $V_{S3}$ duty cycle, with the result that middle sampling signal $\overline{V}_{S3}$ converges on a 50% duty cycle.

Turning to data sampler 22, inverting delay section 44 is typically implemented with an odd number of inverters connected in series. Preferably, delay section 44 consists of three CMOS inverters.

In a preferred embodiment, sampling clock signal $V_{CKD}$ serves as the primary receiver clock signal. The $V_{CKD}$ frequency is 155.5 MHz, corresponding to a data-bit period of 6.4 ns. The $V_A$ clock frequency is thus 311 MHz. Sampling-signal time interval $\Delta t$ is in the range of 100–1, 000 ps, typically 400 ps. The $t_1$–$t_5$ interval is thus typically 1.6 ns, amounting to approximately 25% of the 6.4-ns data-bit period.

Figure 6:
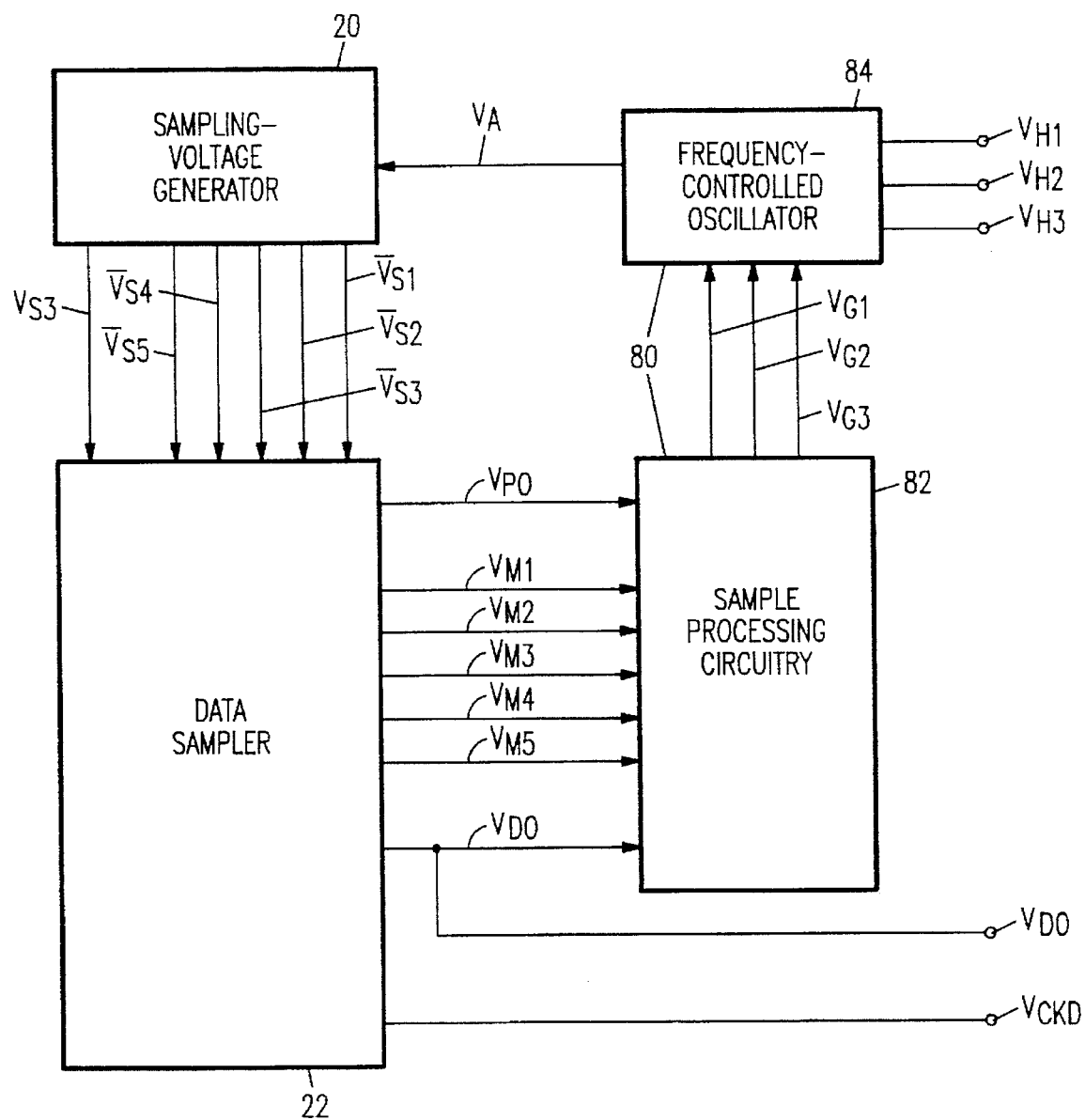
FIG. 6 is a block diagram of a decoder that contains the sampling circuit of FIG. 2.

FIG. 6 illustrates an overall decoder that utilizes the sampling circuit of FIG. 3. In addition to sampling-signal generator 20 and data sampler 22, the decoder of FIG. 6 contains a sample processing portion 80 formed with sample processing circuitry 82 and a frequency-controlled oscillator 84.

Processing circuitry 82 processes data samples $V_{PO}$, $V_{M1}$–$V_{M5}$, and $V_{DO}$ to produce a three-phase error signal $V_{G1}$, $V_{G2}$, and $V_{G3}$ (collectively "$V_G$") at 120° phase differences. Error signal $V_G$ is supplied at a frequency $f_G$ whose magnitude indicates how close receiver sampling clock $V_{CKD}$ is to being in synchronism with the transmitter clock. Signal $V_G$ also indicates whether receiver clock $V_{CKD}$ is behind or ahead of the transmitter clock.

Processing circuitry 82 first decodes data samples $V_{PO}$, $V_{M1}$–$V_{M5}$, and $V_{DO}$ according to the logic represented by the computer program given in the accompanying appendix. Error signal $V_G$ is then generated from the decoded information.

Frequency-controlled oscillator 84 provides input clock signal $V_A$ in response to error signal $V_G$ and a three-phase reference clock signal $V_{H1}$, $V_{H2}$, and $V_{H3}$ (collectively "$V_H$") whose phases differ by 120°. Reference clock signal $V_H$ is supplied at a reference frequency $f_H$, 311 MHz in the preferred embodiment. Oscillator 84 generates clock signal $V_A$ at a frequency equal to $f_H$+$f_G$. Oscillator 84 is preferably implemented in the manner generally described in Wong et al, U.S. Pat. No. 5,132,633.

While the invention has been described with reference to particular embodiments, this description is solely for the purpose of illustration and is not to be construed as limiting the scope of the invention claimed below. For example, the polarities could be reversed from those described above. Each closely spaced group of transitions in the sampling signals could then be generated during an interval when ramp signal $V_E$ rises from $V_{EL}$ to $V_{EH}$. Various applications and modifications may thus be made by those skilled in the art without departing from the true scope and spirit of the invention as defined in the appended claims.

APPENDIX

COMPUTER PROGRAM FOR PROCESSING LOGIC 80

MODULE    ph_decdr
TITLE       'ph_decdr'
               ph_decdr device 'ec20ev8a';
" ph_decdr.c xref: i)nput, r)egistered output, c)ombinatorial output
"_____
"   1------------- cf_prev_mid_sampler   r7   21
"  -1------------ cf_clk40_1                 r5   18

APPENDIX-continued

COMPUTER PROGRAM FOR PROCESSING LOGIC 80

```
"   ---1---------- clk40_in           i10       23
"   ---11--------- dummy              i9..i8    22,16
"   ------1------- lock_180           i7        15
"   -------1111111 sampler_in         i6..i0    14,13,1,2,9,
                                                10,11
"   --------1----- prev_dat_samp      i6        14
"   ------------1--- mid_sampler      i3        2
"   --------------1 dat_sampler       i0        11
"   --------11111- mid_samps          i5..i1    13,1,2,9,10
"---2109876543210-------------------------------
"        1-------- prev_mid_sampler   r7        21
"        -1------- clk40_2            r6        20
"        --1------ clk40_1            r5        18
"        ---1----- positive_edge      r4        17
"        ----1---- no_edge            r3        4
"        -----111  phse_out           r2..r0    5,7,8
"_____ i4       pin 1 ;
         i3       pin 2 ;
         clk      pin 3 ;
         r3       pin 4 istype 'neg,reg' ;
         r2       pin 5 istype 'neg,reg' ;
"        vcc      pin 6 ;
         r1       pin 7 istype 'neg,reg' ;
         r0       pin 8 istype 'neg,reg' ;
         i2       pin 9 ;
         i1       pin 10 ;
         i0       pin 11 ;
"        vee      pin 12 ;
         i5       pin 13 ;
         i6       pin 14 ;
         i7       pin 15 ;
         i8       pin 16 ;
         r4       pin 17 istype 'neg,reg' ;
         r5       pin 18 istype 'neg,reg' ;
"        vcc      pin 19 ;
         r6       pin 20 istype 'neg,reg' ;
         r7       pin 21 istype 'neg,reg' ;
         i9       pin 22 ;
         i10      pin 23 ;
"        vcc      pin 24 ;
"_____ equations
[r7,r6,r5,r4,r3,r2,r1,r0].clk = clk ;
r7   := i3 ;
r6   := r5 ;
r5   := i10 ;
r4   := !i7 & i0
      # i7 & i3 ;
!r3  := !r7 & i7 & i6
      # !i7 & !i6 & i0
      # !i7 & i6 & !i0
      # !i6 & i5 & i4 & i3 & i2 & i1
      # i6 & !i5 & !i4 & !i 3 & !i2 & !i1
      # i7 & !i6 & i3
      # i7 & i7 & !i3 ;
!r2  := !i7 & !i5 & !i4 & !i3 & i2
      # !i7 & i5 & i4 & i3 & !i0
      # !i7 & !i6 & i3
      # i7 & i6 & !i3 ;
!r1  := !i7 & !i5 & !i4 & !i2 & !i1 & i0
      # !i7 & !i5 & !i4 & i3 & i0
      # !i7 & i5 & i4 & !i3 & !i0
      # !i7 & i5 & i4 & i2 & i1 & !i0
      # i7 & !i6 & i3
      # i7 & i6 & !i3 ;
!r0  := !r7 & i7 & !i3
      # !i7 & !i6 & !i5 & !i3 & !i2 & i1
      # !i7 & !i6 & !i0
      # !i7 & !i5 & i4 & i0
      # !i7 & i5 & !i4 & !i0
      # !i7 & i6 & i0
      # !i7 & i6 & i5 & i3 & i2 & !i1
      # r7 & i7 & i3 ;
"file checksum : 8EFD
END ph_decdr
```

We claim:

1. An electronic circuit comprising:
   an input section that produces a ramp signal which switches substantially between a first endpoint voltage and a second endpoint voltage in a substantially periodic manner;
   a reference section that furnishes a plurality of different reference voltages having values between the first and second endpoint voltages; and
   a comparing section that compares the ramp signal to the reference voltages to produce a like plurality of sampling signals respectively corresponding to the reference voltages, each sampling signal making a first voltage transition in response to the ramp signal passing the corresponding reference voltage as the ramp signal goes from the second endpoint voltage to the first endpoint voltage, whereby the first transitions of the sampling signals occur in groups, each group of first transitions being distinctly spread out in time during part of a corresponding period of the ramp signal.

2. A circuit as in claim 1 wherein the input section comprises a capacitive element and a current source/sink, the ramp signal going from the second endpoint voltage to the first endpoint voltage at a rate dependent on discharge of the capacitive element through the current source/sink.

3. A circuit as in claim 1 wherein the ramp signal switches asymmetrically between the endpoint voltages during each period of the ramp signal.

4. A circuit as in claim 3 wherein the ramp signal takes more time to go from the second endpoint voltage to the first endpoint voltage than to go from the first endpoint voltage to the second endpoint voltage.

5. A circuit as in claim 4 wherein the plurality of sampling signals is an odd number of at least 3.

6. A circuit as claim 5 wherein, for each period of the ramp signal, the time interval between consecutive transitions of the ramp signal from the second endpoint voltage to the first endpoint voltage is approximately 25% of the period of the ramp signal, whereby the time interval between consecutive first transitions of the sampling signals is less than 25% of the period of the ramp signal.

7. A circuit as in claim 4 wherein the input section generates the ramp signal in response to an input clock signal having approximately a 50% duty cycle.

8. A circuit as in claim 4 wherein the input section comprises:
   a duty cycle modifier that converts an input clock signal into an intermediate clock signal at a non-50% duty cycle;
   a capacitive element coupled between a first voltage supply and a circuit node at which the ramp signal is provided;
   a current source/sink coupled between the first voltage supply and the circuit node; and
   a transistor, coupled between the circuit node and a second voltage supply different from the first voltage supply, for helping to control the ramp signal in response to the intermediate clock signal.

9. A circuit as in claim 1 wherein a selected one of the sampling signals has approximately a 50% duty cycle.

10. A circuit as in claim 9 wherein there is an odd number of sampling signals of which the middle one of the sampling signals during each transition of the ramp signal from the second endpoint voltage to the first endpoint voltage is the selected sampling signal.

11. A circuit as in claim 9 further including a control section responsive to the selected sampling signal for adjusting the rate at which the ramp signal goes from the second endpoint voltage to the first endpoint voltage so as to force the selected sampling signal towards a 50% duty cycle.

12. A circuit as in claim 11 wherein the input section comprises a capacitive element and a current source/sink, the ramp signal going from the second endpoint voltage to the first endpoint voltage at rate dependent on discharge of the capacitive element through the current source/sink, the control section acting to control the magnitude of current flowing through the current source/sink as a function of the selected sampling signal.

13. A circuit as in claim 11 wherein the comparing section produces an additional sampling signal logically inverse to the selected sampling signal, the control section acting to control the rate at which the ramp signal goes from the second endpoint voltage to the first endpoint voltage so that the average difference between the selected and additional sampling signals approaches zero.

14. A circuit as in claim 11 wherein the control section comprises:

an averager that averages the selected sampling signal and an additional sampling signal logically inverse to the Selected sampling signal in order to respectively produce first and second averaged signals; and an amplifier that amplifies the difference between the averaged signals to generate a control signal for controlling the current source/sink.

15. A circuit as in claim 1 further including a data sampling portion responsive to an input data signal and to the sampling signals for generating a like plurality of primary data samples respectively corresponding to the sampling signals, each primary data sample attaining a value which bears a specified relationship to the instantaneous value of the input data signal that occurs substantially when the corresponding sampling signal makes a first transition, transitions in the primary data signals occurring substantially simultaneously in response to each group of first transitions in the sampling signals.

16. A circuit as in claim 15 wherein the data sampling portion further generates a true data sample that attains a value bearing a specified relationship to the instantaneous value of the input data signal at a time occurring between two consecutive groups of first transitions of the sampling signals.

17. A circuit as in claim 16 wherein the data sampling section further generates a previous data sample that attains a value bearing a specified relationship to the immediately previous value of the true data sample.

18. A circuit as in claim 17 wherein transitions in the primary, true, and previous data samples occur substantially in synchronism with a sampling clock signal that delayingly corresponds to a selected one of the sampling signals.

19. A circuit as in claim 17 further including a sample processing portion for processing the primary, true, and previous data samples to determine whether, and how much, to advance or retard an input clock signal in response to which the input section generates the ramp signal.

20. A circuit as in claim 19 wherein the sample processing portion includes a frequency-controlled oscillator.

21. A circuit as in claim 1 further including a first state section responsive to an input data signal and to the sampling signals for generating a like plurality of first data samples respectively corresponding to the sampling signals, each first data sample attaining a value which bears a specified relationship to the instantaneous value of the input data signal that occurs substantially during a first transition of the corresponding sampling signal.

22. A circuit as in claim 21 wherein the first state section comprises a like plurality of first flip-flops respectively corresponding to the sampling signals, each first flip-flop being loaded with the instantaneous value of the input data signal that occurs substantially during a first transition of the corresponding sampling signal.

23. A circuit as in claim 21 further including a second state section responsive to a state clock signal and to the first data samples for generating a like plurality of second data samples respectively corresponding to the first data samples, the second data samples attaining values which respectively bear specified relationships to the values of the corresponding first data samples that occur substantially when the state clock signal makes a transition of a specified type.

24. A circuit as in claim 23 wherein the second state section comprises a like plurality of second flip-flops respectively corresponding to the first data samples, each second flip-flop being loaded with the value of the corresponding first data sample that occurs substantially when the state clock signal makes a transition of the specified type.

25. A circuit as in claim 23 wherein:

the comparing section produces an additional sampling signal logically inverse to a selected one of the sampling signals, the additional sampling signals making a first voltage transition in response to the ramp signal going from the first endpoint voltage to the second endpoint voltage;

the first state section generates a first true data sample which attains a value bearing a specified relationship to the instantaneous value of the input data signal that occurs substantially during a first transition of the additional sampling signal; and the second state section generates a second true data sample which attains a value bearing a specified relationship to the value of the first true data sample that occurs substantially when the state clock signal makes a transition of the specified type.

26. A circuit as in claim 25 wherein the second state section generates a previous data sample which attains a value bearing a specified relationship to the value of the first true data sample that occurs when the state clock signal makes the immediately previous transition of the specified type.

27. A circuit as in claim 23 further including a delay section that delays a selected one of the sampling signals in an inverting or non-inverting manner to produce the state clock signal.

28. A circuit as in claim 27 wherein the plurality of sampling signals is an odd number of at least 5.

29. A circuit as in claim 1 wherein the endpoint voltages change, at most, slowly compared to the sampling voltages during steady-state operation of the circuit.

30. A circuit as in claim 1 wherein the input section produces the ramp signal in response to an input clock signal that switches between a pair of different clock voltage levels at a clock period related to the period of the ramp signal.

* * * * *